(12) United States Patent
Jung et al.

(10) Patent No.: US 7,648,866 B2
(45) Date of Patent: Jan. 19, 2010

(54) METHOD OF MANUFACTURING DRIVING-DEVICE FOR UNIT PIXEL OF ORGANIC LIGHT EMITTING DISPLAY

(75) Inventors: Ji-sim Jung, Yongin-si (KR); Jung-seok Hahn, Yongin-si (KR); Sang-yoon Lee, Yongin-si (KR); Jong-man Kim, Yongin-si (KR); Jang-yeon Kwon, Yongin-si (KR); Kyung-bae Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 203 days.

(21) Appl. No.: 11/958,719

(22) Filed: Dec. 18, 2007

(65) Prior Publication Data
US 2008/0153214 A1    Jun. 26, 2008

(30) Foreign Application Priority Data
Dec. 22, 2006   (KR)   ................. 10-2006-0133094

(51) Int. Cl.
*H01L 21/00*   (2006.01)
(52) U.S. Cl. .................. 438/166; 438/164; 438/486; 257/E21.412
(58) Field of Classification Search ............. 438/164, 438/166, 486; 257/E21.412, E51.018
See application file for complete search history.

(56) References Cited

U.S. PATENT DOCUMENTS

| | | | | |
|---|---|---|---|---|
| 5,789,762 | A | * | 8/1998 | Koyama et al. ............... 257/66 |
| 5,858,823 | A | * | 1/1999 | Yamazaki et al. ........... 438/166 |
| 7,282,738 | B2 | * | 10/2007 | Couillard et al. ............. 257/64 |

* cited by examiner

*Primary Examiner*—Brook Kebede
*Assistant Examiner*—Maria Ligai
(74) *Attorney, Agent, or Firm*—Cantor Colburn LLP

(57) ABSTRACT

Provided is a method of manufacturing a driving-device for a unit pixel of an organic light emitting display having an improved manufacturing process in which the driving device can be manufactured with a smaller number of processes and in simpler processes. The method includes: forming an amorphous silicon layer including a first amorphous region and a second amorphous region disposed on the same plane of a substrate; forming an SAM (self-assembled monolayer) having a hydrophobic property on the first amorphous region; coating an aqueous solution in which nickel particles are dispersed, on the second amorphous region and the SAM, wherein a larger amount of nickel particles than on the SAM are dispersed on the second amorphous region using a hydrophilicity difference between the second amorphous region and the SAM; vaporizing the SAM through an annealing process and simultaneously performing metal induced crystallization in which the nanoparticles are used as a medium, to crystallize the first and second amorphous regions and to form first and second crystallization regions; patterning the first and second crystallization regions to form first and second channel regions; and forming first and second electrodes on the first and second channel regions.

21 Claims, 11 Drawing Sheets

SMALL GRAIN

LARGE GRAIN

METHOD OF MANUFACTURING DRIVING-DEVICE FOR UNIT PIXEL OF ORGANIC LIGHT EMITTING DISPLAY

CROSS-REFERENCE TO RELATED PATENT APPLICATIONS

This application claims the benefit of Korean Patent Application No. 10-2006-0133094, filed on Dec. 22, 2006, in the Korean Intellectual Property Office, the disclosure of which is incorporated herein in its entirety by reference.

BACKGROUND OF THE INVENTION

1. Field of the Invention

The present invention relates to a method of manufacturing a driving-device for a unit pixel of an organic light emitting display, and more particularly, to a method of manufacturing a driving-device for a unit pixel of an organic light emitting display having an improved manufacturing process in which the driving device can be manufactured with a smaller number of processes and in simpler processes.

2. Description of the Related Art

Liquid crystal displays (LCDs) which are light and have low power consumption, have been most noticed in the field of flat panel displays (FPDs). However, since LCDs are light-receiving type displays, there are technical restrictions in brightness, contrast, view angle, and large size or the like. Development for new FPDs that can overcome these disadvantages has briskly proceeded.

Organic light emitting displays, which are one of new FPDs, have a two-dimensional arrangement of unit organic light emitting devices (OLEDs) and are a self light-emitting type. Thus, organic light emitting displays have excellent characteristics, such as excellent view angle and contrast and do not need backlights. Thus, organic light emitting displays can be made lighter and smaller and are advantageous to power consumption. In addition, since organic light emitting displays can be directly driven by low voltages, have a fast response speed and are entirely solid bodies, the organic light emitting displays are strong to an external shock and have a wide usage temperature range, and in particular, have low manufacturing costs. In particular, if organic light emitting displays are driven using an active matrix method by which transistors as switching devices are disposed in each pixel, the organic light emitting displays show the same brightness even if low currents are applied to the organic light emitting displays. Thus, the organic light emitting displays have low power consumption and high definition and can be made large.

Two thin film transistors (TFTs), that is, a switching TFT and a driving TFT, must be provided in each unit pixel of the active matrix type organic light emitting displays, so as to drive an OLED. The switching TFT turns on/off a current supplied to each unit pixel, and the driving TFT provides currents allocated to the OLED. Due to this role assignment, characteristics and specifications required for the switching TFT and the driving TFT are different. For example, the switching TFT must have a small leakage current and a large on/off ratio. On the other hand, the driving TFT is required to have high mobility and reliability. In order to meet the requirements, the switching TFT needs to be formed in a structure including an amorphous silicon channel region or a polycrystalline silicon channel region having a very small grain size, and contrary to this, the driving TFT needs to be formed in a structure including a polycrystalline silicon channel region having a comparatively large grain size.

However, to this end, a process of manufacturing the switching TFT and a process of manufacturing the driving TFT must be separately performed. Thus, there are problems that manufacturing costs increase and manufacturing processes are complicated. Meanwhile, when an amorphous silicon TFT is simultaneously used as a switching TFT and a driving TFT, the amorphous silicon TFT is worthy of a switching TFT but has low electron mobility and reliability to be used as a driving transistor. Thus, it is difficult to implement an OLED having excellent characteristics. Contrary to this, when a polycrystalline silicon TFT is used as a switching TFT, the polycrystalline silicon TFT is worthy of a driving TFT but has a large leakage current in an off-state to be used as a switching transistor. Thus, the function of the polycrystalline silicon TFT as a switching transistor is lowered and it is difficult to implement an OLED having excellent characteristics.

SUMMARY OF THE INVENTION

The present invention provides a method of manufacturing a driving-device for a unit pixel of an organic light emitting display having an improved manufacturing process in which the driving device can be manufactured with a smaller number of processes and in simpler processes.

According to an aspect of the present invention, there is provided a method of manufacturing a driving-device for a unit pixel of an organic light emitting display, the method comprising: forming an amorphous silicon layer including a first amorphous region and a second amorphous region disposed on the same plane of a substrate; forming an SAM (self-assembled monolayer) having a hydrophobic property on the first amorphous region; coating an aqueous solution in which nickel particles are dispersed, on the second amorphous region and the SAM, wherein a larger amount of nickel particles than on the SAM are dispersed on the second amorphous region using a hydrophilicity difference between the second amorphous region and the SAM; vaporizing the SAM through an annealing process and simultaneously performing metal induced crystallization in which the nanoparticles are used as a medium, to crystallize the first and second amorphous regions and to form first and second crystallization regions; patterning the first and second crystallization regions to form first and second channel regions; and forming first and second electrodes on the first and second channel regions.

The first crystallization region may be formed to have a first grain size and the second crystallization region may be formed to have a second grain size that is smaller than the first grain size. The first grain size may be in the range of 10 to 300 µm. The second grain size may be in the range of 0.01 to 50 µm.

According to the present invention, the driving device for a unit pixel of an organic light emitting display including a pair of a switching TFT and a driving TFT can be manufactured by a series of consecutive processes.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
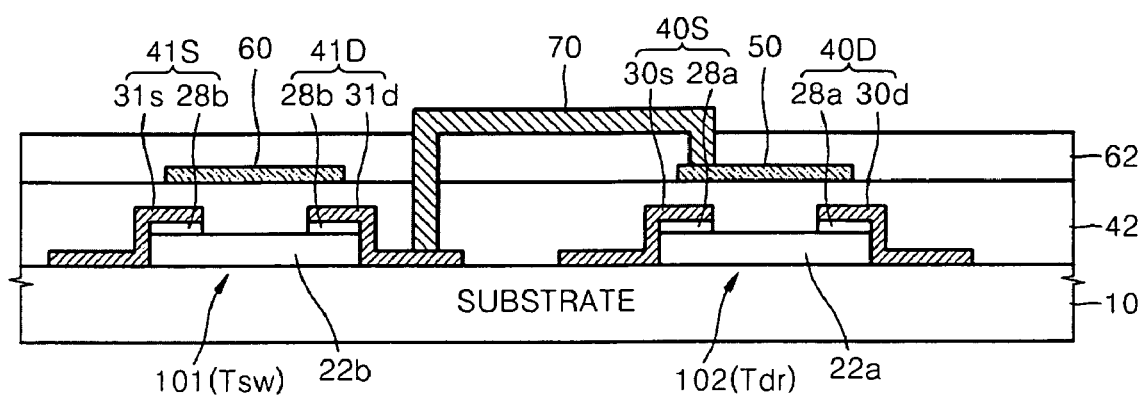
FIG. 1 is a schematic cross-sectional view of a driving device for a unit pixel of an organic light emitting display according to an embodiment of the present invention.

The present invention will now be described more fully with reference to the accompanying drawings, in which exemplary embodiments of the invention are shown. In the drawings, the thicknesses of layers and regions are exaggerated for clarity.

FIG. 1 is a schematic cross-sectional view of a driving device for a unit pixel of an organic light emitting display according to an embodiment of the present invention.

Referring to FIG. 1, according to an embodiment of the present invention, a driving device for a unit pixel of an organic light emitting display including a pair of a switching thin film transistor (TFT)($T_{sw}$) 101 and a driving TFT($T_{dr}$) 102, which are electrically connected to each other, is formed on a substrate 10.

The driving TFT 102 includes a first channel region 22a and a first gate electrode 50, which is formed on the first channel region 22a and faces the first channel region 22a. The driving TFT 102 is formed in a top gate structure, as illustrated in FIG. 1. A first insulating layer 42, that is, a gate insulating layer, is interposed between the first channel region 22a and the first gate electrode 50, and a first source region 40S and a first drain region 40D are formed at one end and the other end of the first channel region 22a, respectively. The first source region 40S may include an n-doped or p-doped Si layer 28a and a first source electrode 30s, which are sequentially stacked on the one end of the first channel region 22a. The first drain region 40D may include an n-doped or p-doped Si layer 28a and a first drain electrode 30d, which are sequentially stacked on the other end of the first channel region 22a. Here, the n-doped Si layer 28a is an Si layer including an n-type dopant such as As and P and may be formed using a deposition process separately from the first channel region 22a.

The switching TFT 101 includes a second channel region 22b and a second gate electrode 60, which is formed on the second channel region 22b and faces the second channel region 22b. The switching TFT 101 is formed in a top gate structure like in the driving TFT 102. A first insulating layer 42, that is, a gate insulating layer, is interposed between the second channel region 22b and the second gate electrode 60, and a second source region 41S and a second drain region 41D are formed at one end and the other end of the second channel region 22b, respectively. The second source region 41S may include an n-doped or p-doped Si layer 28b and a second source electrode 31s, which are sequentially stacked on the one end of the second channel region 22b. The second drain region 41D may include an n-doped or p-doped Si layer 28b and a second drain electrode 301, which are sequentially stacked on the other end of the second channel region 22b. Here, the n-doped Si layer 28b is an Si layer including an n-type dopant, such as As and P and may be formed using a deposition process separately from the second channel region 22b.

According to exemplary embodiments of the present invention, the second source region 41S or the second drain region 41D may be connected to the first gate electrode 50 via a first interconnection line 70 so that an electrical signal can be input to the driving TFT 102 from the switching TFT 101.

In the structure of a driving device for a unit pixel of an organic light emitting display according to the present invention, the switching TFT 101 turns on/off a current supplied to the unit pixel, and the driving TFT 102 provides currents allocated to an organic light emitting device (OLED) (not shown) formed in the unit pixel. Due to this role assignment, characteristics and specifications required for the switching TFT 101 and the driving TFT 102 are different. For example, the switching TFT 101 must have a small leakage current and a large on/off ratio. On the other hand, the driving TFT 102 is required to have high mobility and reliability. In order to meet the requirements, the switching TFT 101 needs to be formed in a structure including an amorphous silicon channel region or a polycrystalline silicon channel region having a very small grain size, and contrary to this, the driving TFT 102 needs to be formed in a structure including a polycrystalline silicon channel region having a comparatively large grain size. Due to these needs, the driving device for a unit pixel of an organic light emitting display according to the present invention forms polycrystalline silicon channel regions having different grain sizes in each of the switching TFT 101 and the driving TFT 102 and controls the grain sizes of the polycrystalline silicon channel regions to a proper size. Specifically, the first channel region 22a of the driving TFT 102 is formed to have a first grain size which is between 10 to 300 μm, and the second channel region 22b is formed to have a second grain size which is between 0.01 to 50 μm. According to the present invention, the structure of the driving device for a unit pixel of an organic light emitting display has been improved so that channels in a switching TFT and a driving TFT can be simultaneously formed in one process. As a result, the driving device for a unit pixel of an organic light emitting display according to the present invention can be manufactured in a smaller number of processes and in simpler and easier processes compared to the prior art.

Figure 2A:
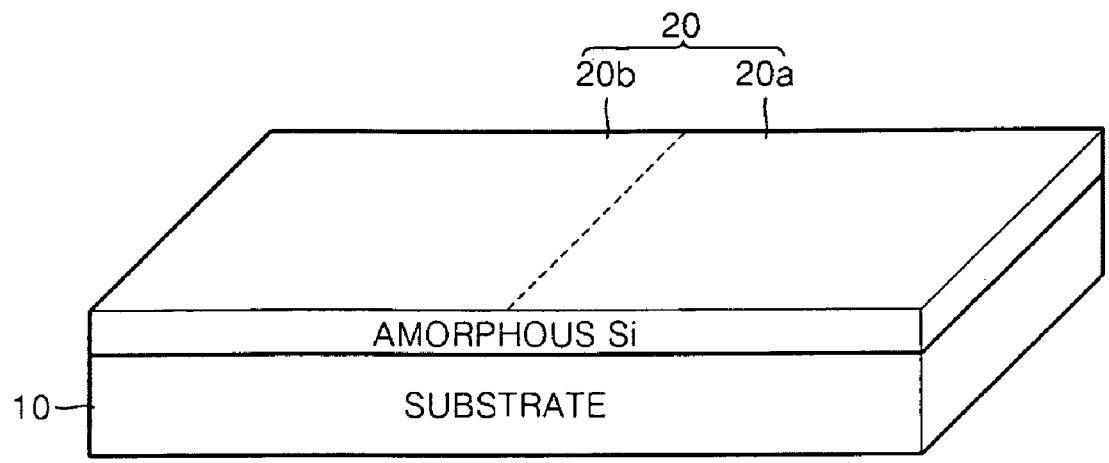
FIGS. 2A through 2Q are flowcharts illustrating a method of manufacturing a driving-device for a unit pixel of an organic light emitting display according to an embodiment of the present invention.
Figure 2B:
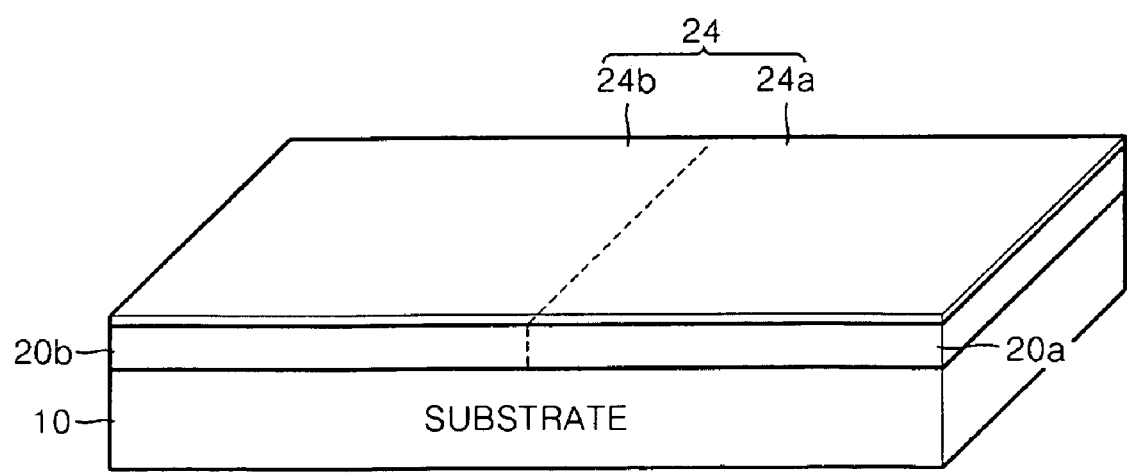
Figure 2C:
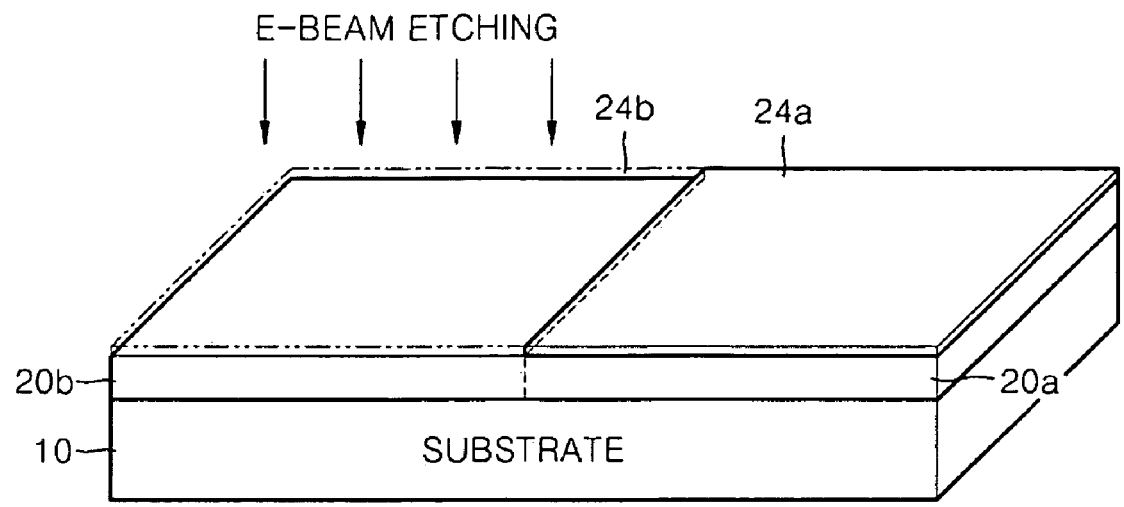
Figure 2D:
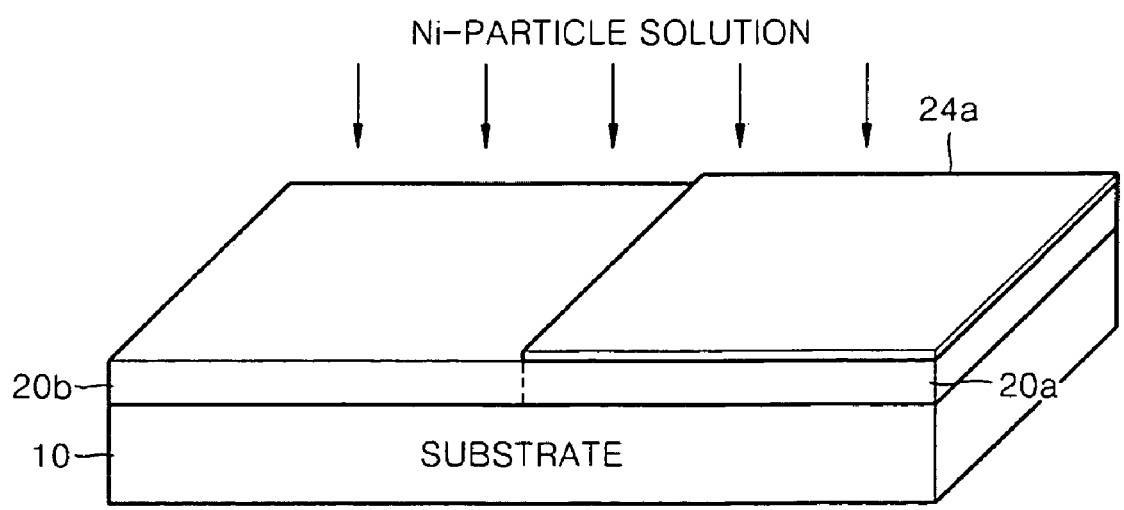
Figure 2E:
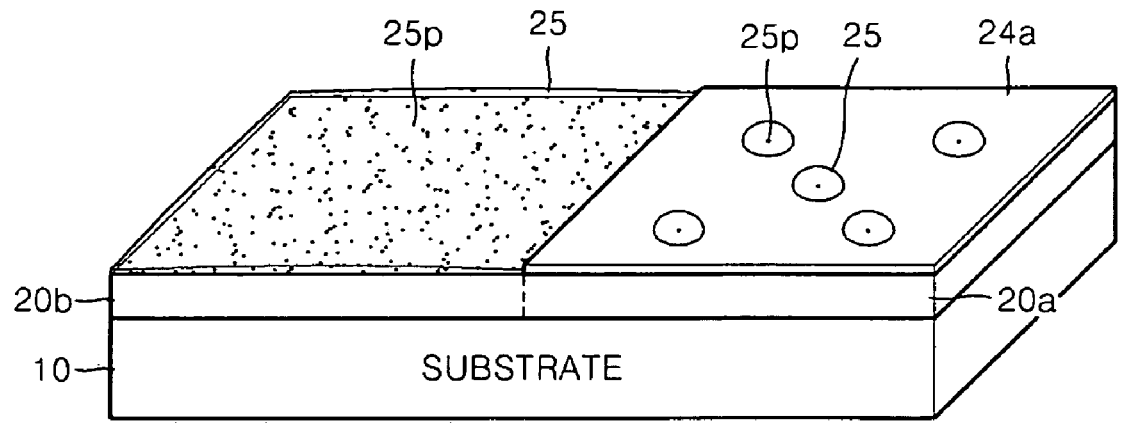
Figure 2F:
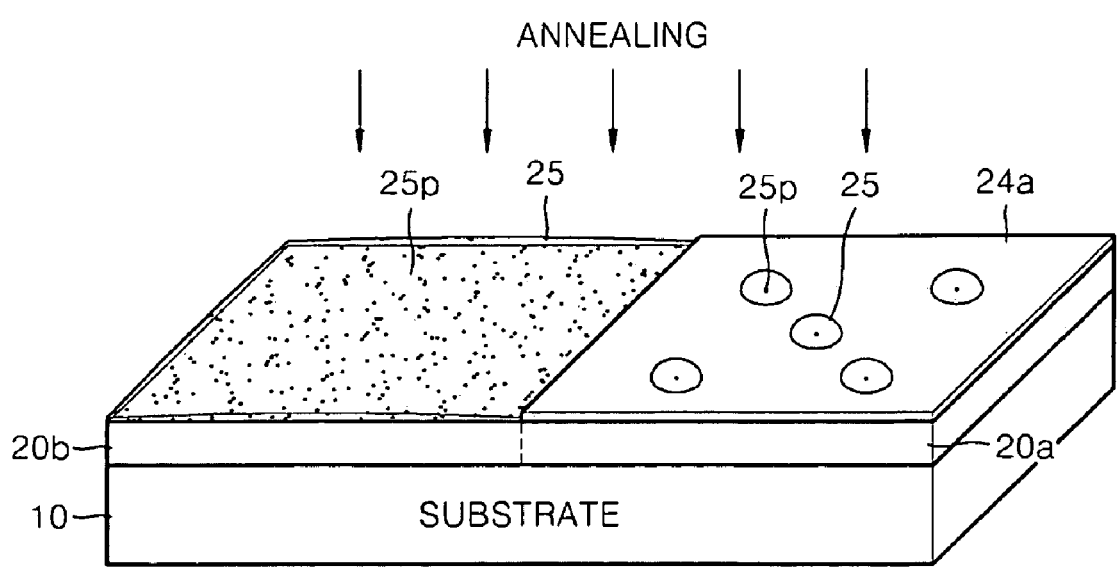
Figure 2G:
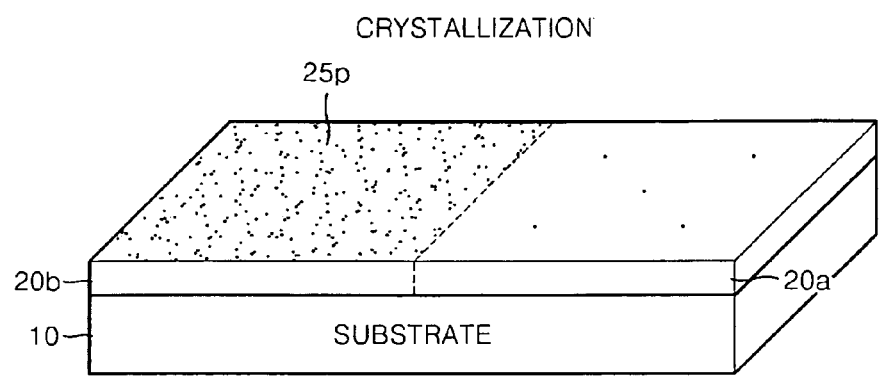
Figure 2H:
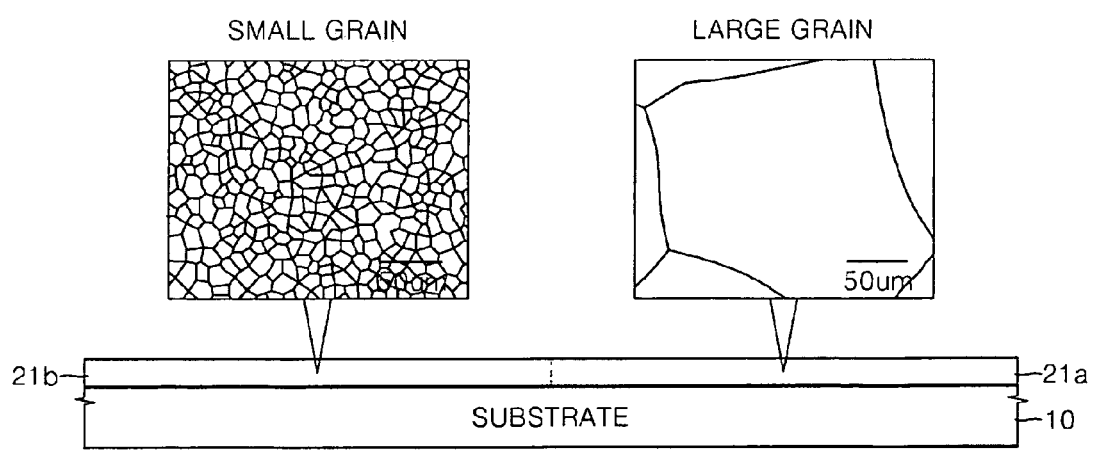
Figure 2I:
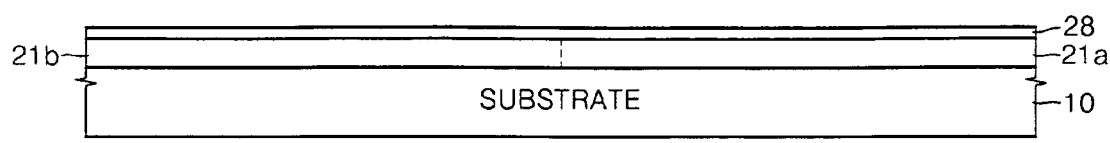
Figure 2J:
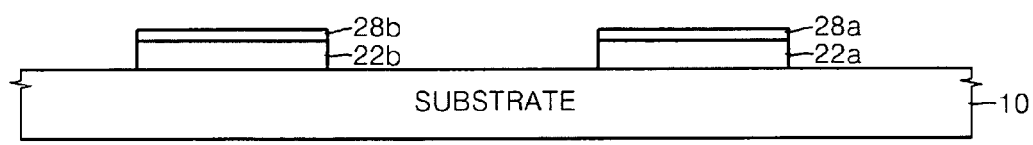
Figure 2K:
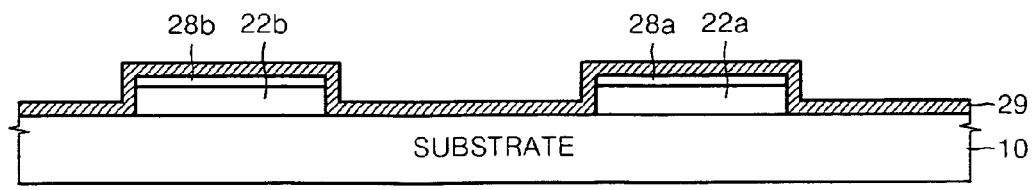
Figure 2L:
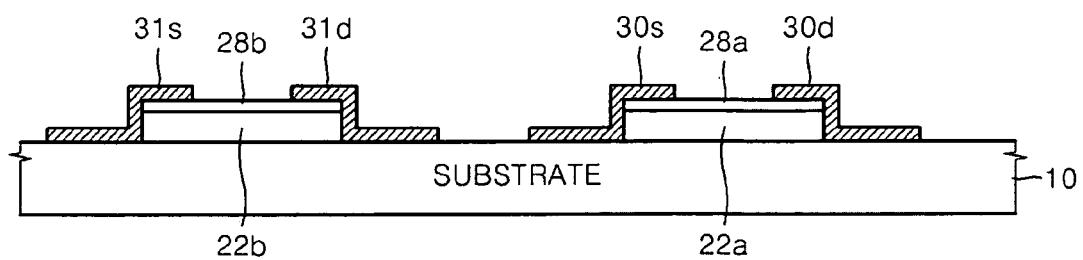
Figure 2M:
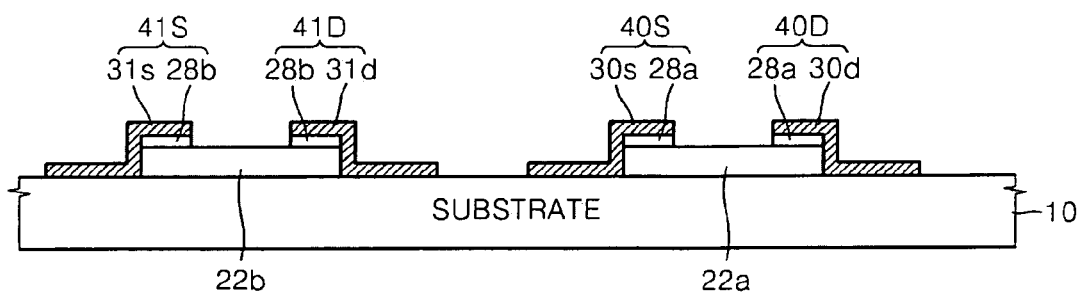
Figure 2N:
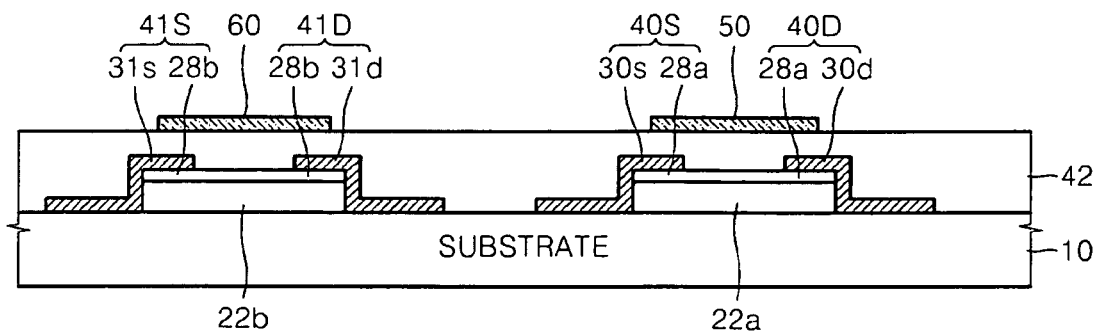
Figure 2O:
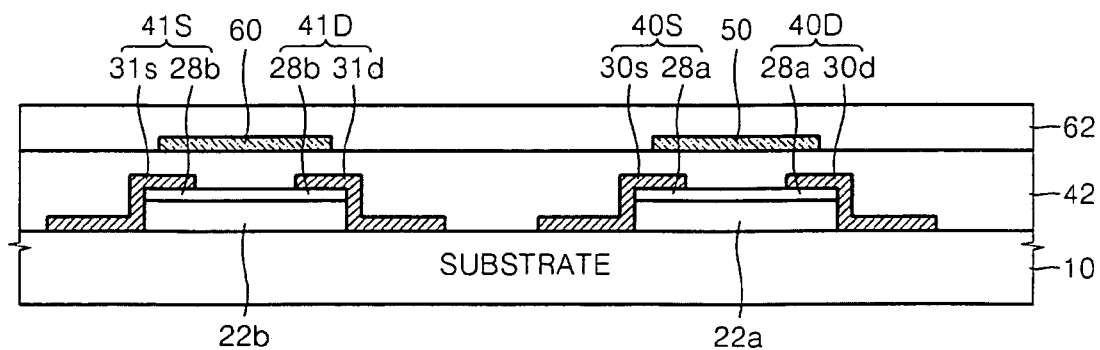
Figure 2P:
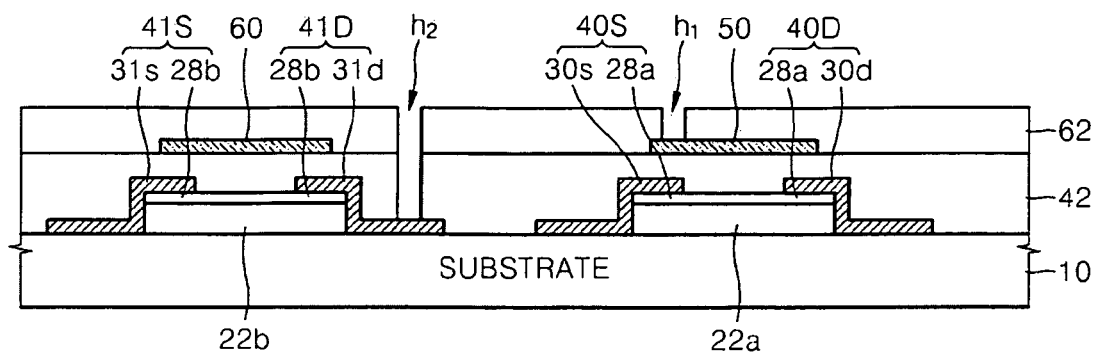
Figure 2Q:
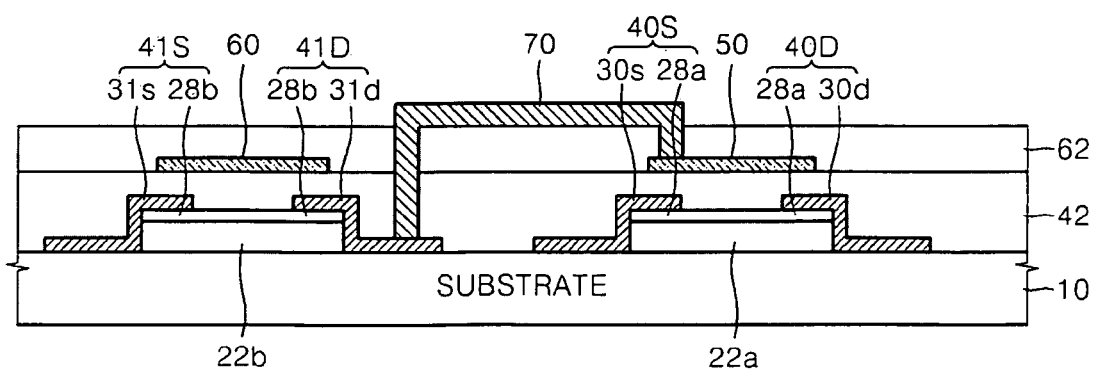

FIGS. 2A through 2Q are flowcharts illustrating a method of manufacturing a driving-device for a unit pixel of an organic light emitting display according to an embodiment of the present invention. In the method illustrated in FIGS. 2A through 2Q, each thin layer may be formed using thin layer deposition processes that are generally used in a semiconductor manufacturing process, for example, physical vapor deposition (PVD), chemical vapor deposition (CVD) or plasma enhanced chemical vapor deposition (PECVD).

Referring to FIGS. 2A and 2B, firstly, an amorphous silicon layer 10 and a self-assembled monolayer (SAM) 24 are sequentially formed on a substrate 10. The substrate 10 may be an amorphous substrate or an insulating substrate. The amorphous silicon layer 20 may be formed to a thickness of 500 to 2000 Å. For explanatory conveniences, the amorphous silicon layer 20 is defined to include a first amorphous region 20a and a second amorphous region 20b, which are disposed on the same plane of the substrate 10. For example, after the substrate 10 is installed into a PECVD chamber, the temperature of the PECVD chamber is kept at 20° C. to 500° C., and $SiH_4$ (gas) and $H_2$ (gas) are supplied into the PECVD chamber and are reacted for 5 to 60 minutes so that the amorphous silicon layer 20 can be formed on the substrate 10.

Next, the SAM 24 is formed on the amorphous silicon layer 20 to a thickness of 3 to 100 Å. The SAM 24 may be formed of material such as $R^1(R^2)_n SiCl_{3-n}$, $R^1(R^2)_n Si(OCH_3)_{3-n}$ or $R^1(R^2)_n Si(OCH_2CH_3)_{3-n}$ (n=0, 1, 2). Here, $R^1$ is a straight, branched or cyclic $C_1$-$C_{10}$ alkyl group, a $C_3$-$C_{20}$ cycloalkyl group, a $C_2$-$C_{10}$ alkenyl group or a fluorine-substituted group thereof, and $R^2$ is hydrogen, a methyl or ethyl group. It is generally known that the SAM 24 has a hydrophobic property. The hydrophobic property may be very useful in a process of manufacturing the driving-device for a unit pixel of an organic light emitting display according to the present invention. Since a method of forming the SAM 24 is generally and wisely known, a detailed description thereof will be omitted. Only, in the present embodiment, a PTS solution, which is manufactured by melting propyltrichlorosilane (PTS) 17.74 mg in anhydrous toluene 100 ml, was used, and the substrate 10 on which the amorphous silicon layer 20 is formed was dipped into the PTS solution for 10 minutes to form the SAM 24. In the dipping process, reactions such as hydroxylation, condensation, and surface adsorption occur on the surface of the amorphous silicon layer 20 such that the SAM 24 can be formed. After the SAM 24 is formed, the top surface of the SAM 24 was rinsed using toluene and ethanol and then was dried.

In the present embodiment, in order to immediately form the SAM 24 through dipping, chlorosilane and methoxysilane having a comparatively large reaction property were used. In addition, in order to form a layer as thin as possible in preparation to a subsequent etching process, a low molecular weight material was used. Besides, a larger hydrophobic property may be given to the SAM 24 by using a fluorine-substituted material according to needs.

Referring to FIGS. 2C through 2E, an SAM region 24b formed on the second amorphous region 20b is selectively etched and removed by using a lithography process using laser, UV or E-beam. As a result, the second amorphous region 20b can be exposed. Next, an aqueous solution 25 in which nickel particles 25p are dispersed is coated on the exposed second amorphous region 20b and the SAM 24 using a method such as spin coating. Here, the nickel particles 25p are mixed in water or HCl diluted solution so that a nickel particle-dispersed aqueous solution 25 can be easily manufactured.

The SAM 24a has a hydrophobic property. However, contrary to this, the second amorphous region 20b has a hydrophilic property. Thus, a hydrophilicity difference between the second amorphous region 20b and the SAM 24a is generated. As a result, as illustrated in FIG. 2E, a sufficient amount of nickel particle-dispersed aqueous solution 25 may be covered on the second amorphous region 20b. However, contrary to this, a small amount of nickel particle-dispersed aqueous solution 25 may remain on the SAM 24a having a hydrophobic property. Specifically, a contact angle of the nickel particle-dispersed aqueous solution 25 with the SAM 24a may be controlled in the range of 60°-100°. A contact angle of the nickel particle-dispersed aqueous solution 25 with the second amorphous region 20b may be controlled in the range of 20°-50°. By using such a hydrophilicity difference between the second amorphous region 20b and the SAM 24a, a larger mount of nickel particles 25p than on the SAM 24a can be dispersed on the second amorphous region 20b.

Referring to FIGS. 2F through 2H, the first and second amorphous regions 20a and 20b and the SAM 24a are thermally-treated or annealed at 350° C.-700° C., thereby vaporizing the SAM 24a and simultaneously, performing metal induced crystallization in which the nickel particles 25b are used as a medium. As such, the first and second amorphous regions 20a and 20b are crystallized and first and second crystallization regions 21a and 21b can be formed from the crystallized first and second amorphous regions 20a and 20b. Here, a metal inducted crystallization process has been already and wisely known, and thus a detailed theory or description thereof will be omitted. When the first and second amorphous regions 20a and 20b and the SAM 24a are thermally-treated at 350° C.-700° C., the SAM 24a may be vaporized and removed. As the SAM 24a is vaporized, a small amount of nickel particles 25p that remain on the SAM 24a are transferred or moved to the first amorphous region 20a formed under the SAM 24a and may affect crystallization of the first amorphous region 20a. Since only the small amount of nickel particles 25 are involved in crystallization of the first amorphous region 20a, the first crystallization region 21a formed from the first amorphous region 20a has a comparatively large first grain size of about 10 to 300 μm (see FIG. 2H). However, since a large amount of nickel particles 25p are involved in crystallization of the second amorphous region 20b, the second crystallization region 21b formed from the second amorphous region 20b has a smaller grain size than the first grain size, that is, 0.01 to 50 μm (see FIG. 2H).

Referring to FIGS. 2I and 2J, an n-doped or p-doped Si layer 28 is formed on the first and second crystallization regions 21a and 21b to a thickness of 200 to 1000 Å. Here, As or P is used as an n dopant, and the n dopant is supplied into the PECVD chamber together with SiH$_4$ (gas) and H$_2$ (gas). In the present process, the n-doped or p-doped Si layer 28 is formed using a separate deposition process but the present invention is not limited to this. The n-doped or p-doped Si layer 28 may be formed using other methods such as ion implantation.

Next, the first and second crystallization regions 21a and 21b and the n-doped or p-doped Si layer 28 are patterned, thereby forming first and second channel portions. Here, the first channel portion includes a first channel region 22a and an n-doped or p-doped Si layer 28a stacked on the first channel region 22a. The second channel portion includes a second channel region 22b and an n-doped or p-doped Si layer 28b stacked on the second channel region 22b.

Referring to FIGS. 2K through 2M, an electrode layer 29 covering the first and second channel portions is formed on the substrate 10 using metal, such as Al or Mo, to a thickness of 2000 to 4000 Å and then is patterned, thereby forming a first source electrode 30s and a first drain electrode 30d at one end and the other end of the first channel portion, respectively, and forming a second source electrode 31s and a second drain electrode 31d at one end and the other end of the second channel portion, respectively.

Next, a region of the n-doped Si layer 28a connecting the first source electrode 30s and the first drain electrode 30d is selectively etched, thereby exposing a top surface of the first channel region 22a. In this case, a process of etching the n-doped Si layer 28a may be performed by using the first source electrode 30s and the first drain electrode 30d as a mask. A process of patterning the electrode layer 29 and a process of etching the n-doped Si layer 28a so as to form the first source electrode 30s and the first drain electrode 30d may be performed simultaneously at one time.

In addition, by using same method as the process of etching the n-doped Si layer 28a, a region of the n-doped Si layer 28b connecting the second source electrode 31s and the second drain electrode 31d is selectively etched, thereby exposing a top surface of the second channel region 22b. In this case, a process of etching the n-doped Si layer 28b may be performed by using the second source electrode 31s and the second drain electrode 31d as a mask. The process of patterning the electrode layer 29 and the process of etching the n-doped Si layer 28b so as to form the second source electrode 31s and the second drain electrode 31d may be simultaneously performed at one time.

As a result of performing the process of FIG. 2M, a first source region 40S and a first drain region 40D may be formed at one end and the other end of the first channel region 22a, respectively. Here, the first source region 40S includes an n-doped or p-doped Si layer 28a and a first source electrode 30s, which are sequentially stacked, and the first drain region 40D includes an n-doped or p-doped Si layer 28a and a first drain electrode 30d, which are sequentially stacked. Similarly, a second source region 41S and a second drain region 41D may be formed at one end and the other end of the second channel region 22b, respectively. Here, the second source region 41S includes an n-doped or p-doped Si layer 28b and a second source electrode 31s, which are sequentially stacked, and the second drain region 41D includes an n-doped or p-dope Si layer 28b and a second drain electrode 31d, which are sequentially stacked.

Referring to FIG. 2N, a first insulating layer 42 is formed on the substrate 10 using a material, such as $SiO_x$ or $SiN_x$, so that all of the first channel region 22a, the second channel region 27b, the first source region 40S, the first drain region 40D, the second source region 40D, and the second drain region 41D are buried in the first insulating layer 42. Next, a gate metal, such as Al or Mo, is deposited on the first insulating layer 42 to a thickness of 2000 to 4000 Å and then is patterned, thereby forming first and second gate electrodes 50 and 60. The first gate electrode 50 is formed on the first channel region 22a, and the second gate electrode 60 is formed on the second channel region 22b.

Referring to FIGS. 2O through 2Q, the second drain electrode 31d is connected to the first gate electrode 50 via a first interconnection line 70 so that an electrical signal can be input to the first gate electrode 50 from the second drain electrode 31d.

Specifically, a second insulating layer 62 is formed on the first insulating layer 42 using a material, such as $SiO_x$ or $SiN_x$, so as to bury the first and second gate electrodes 50 and 60. Thereafter, partial regions of the second insulating layer 62 and the first insulating layer 42 are etched, thereby forming a first contact hole $h_1$ through which a partial region of the first gate electrode 50 is exposed and forming a second contact hole $h_2$ through which a partial region of the second drain electrode 31d is exposed. Next, a conductive material, such as Al or Mo, is filled in each of the first and second contact holes $h_1$ and $h_2$, thereby forming the first interconnection line 70 that connects the second drain electrode 31d and the first gate electrode 50. Through the processes, the driving device for a unit pixel of an organic light emitting display according to the present invention can be manufactured. In particular, according to the present invention, the structure of the driving device for a unit pixel of an organic light emitting display and a method of manufacturing the same have been improved so that channels in a switching TFT and a driving TFT can be simultaneously formed in one process. As a result, the driving device for a unit pixel of an organic light emitting display according to the present invention can be manufactured in a smaller number of processes and in simpler and easier processes compared to the prior art.

Figure 3:
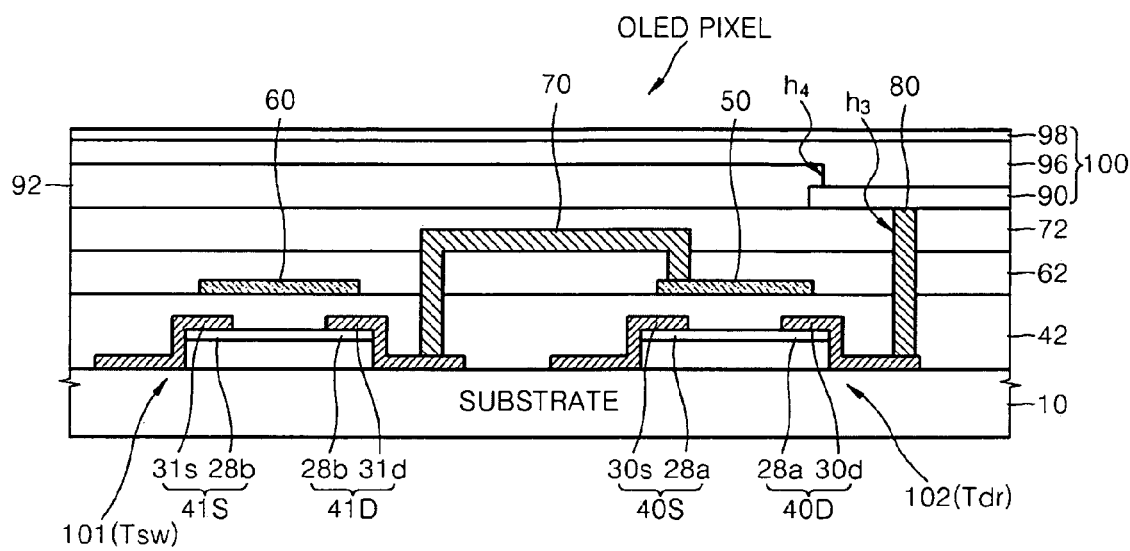
FIG. 3 is a schematic cross-sectional view of a unit pixel of an organic light emitting display manufactured according to an embodiment of the present invention.
Figure 4:
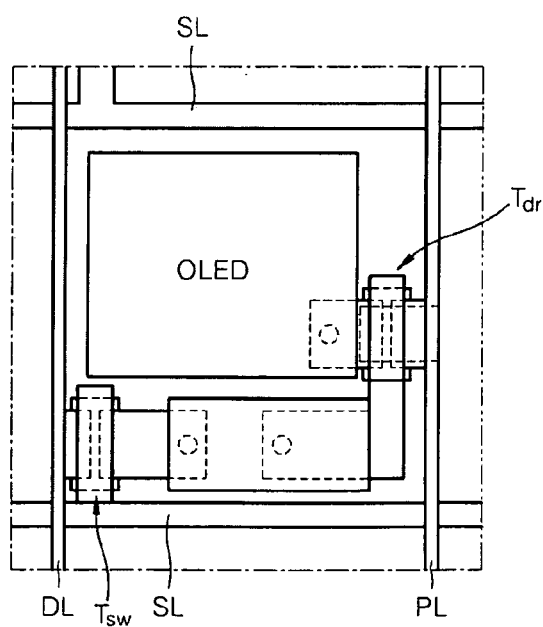
FIG. 4 illustrates a layout of main configuration of the unit pixel of an organic light emitting display illustrated in FIG. 3.
Figure 5:
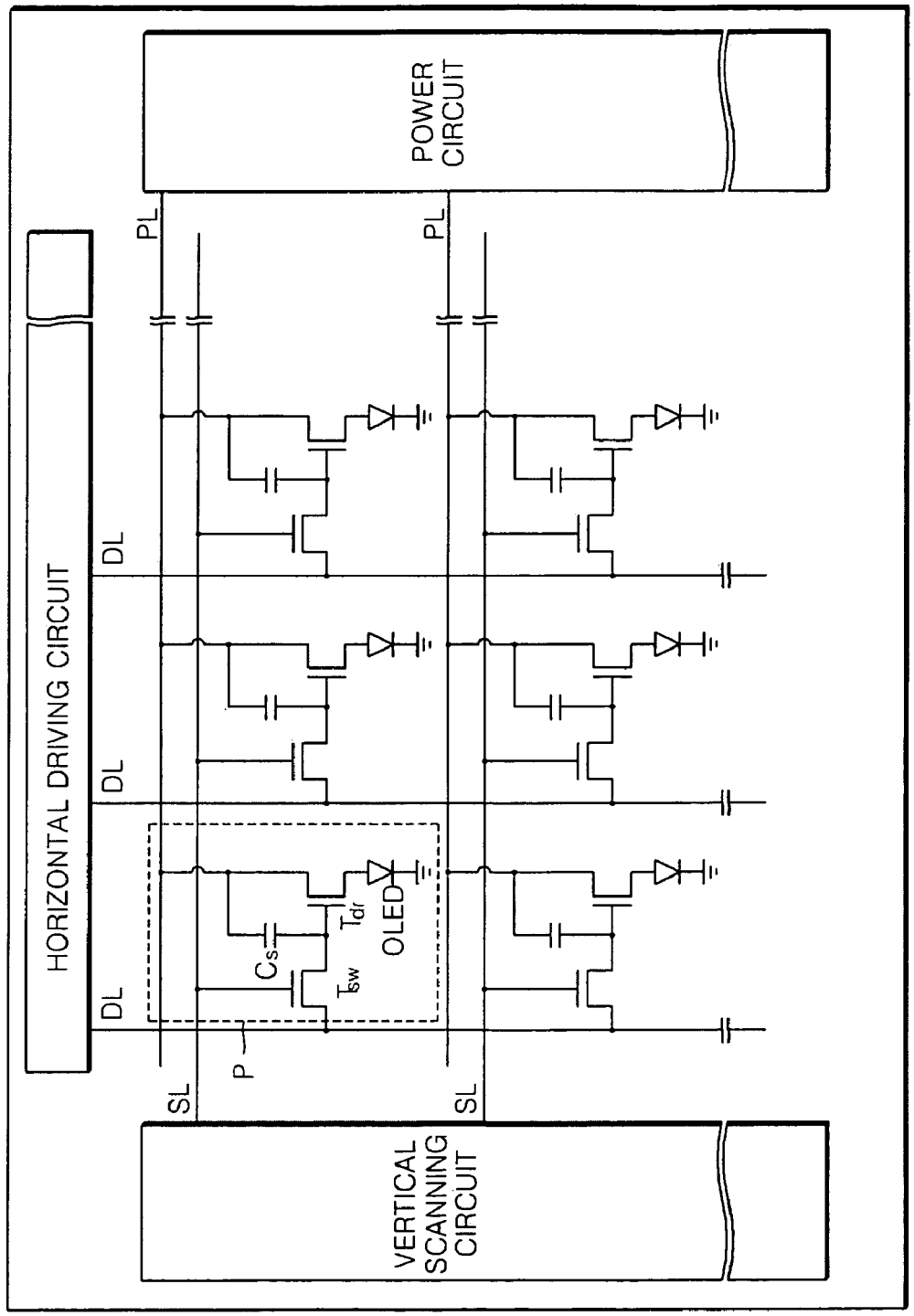
FIG. 5 is an equivalent circuit diagram showing a schematic structure of an organic light emitting display manufactured according to an embodiment of the present invention.

FIG. 3 is a schematic cross-sectional view of a unit pixel of an organic light emitting display manufactured according to an embodiment of the present invention, FIG. 4 illustrates layout of main configuration of the unit pixel of an organic light emitting display illustrated in FIG. 3, and FIG. 5 is an equivalent circuit diagram showing a schematic structure of an organic light emitting display manufactured according to an embodiment of the present invention.

Referring to FIGS. 3 through 5, the organic light emitting display is disposed on a substrate 10 in a matrix shape and includes a plurality of unit pixels (P). Each of the unit pixels (P) includes a driving device for a unit pixel having a pair of a switching TFT 101 and a driving TFT 102, which are connected to each other, and an organic light emitting device (OLED) 100 for a unit pixel. Here, the structure of a driving device for a unit pixel of an organic light emitting display including the switching TFT 101 and the driving TFT 102 and a method of manufacturing the same have been already described and thus, a detailed description thereof will not be repeated.

Referring to FIG. 3, the OLED 100 for a unit pixel includes a first electrode 90, an organic light emitting layer 96, and a second electrode 98, which are sequentially stacked. The first electrode may be formed of a transparent conductive material, such as indium tin oxide (ITO), and serves as an anode. A material used in forming the organic light emitting layer 96 and a method of manufacturing the same are well-known to those of ordinary skill in the art and thus, a detailed description thereof will not be repeated. The second electrode 98 may be formed of a conductive material, such as Al or Ag, and serves as a cathode. The first electrode 90 of the OLED 100 is formed to be connected to a second drain electrode 31d of the driving TFT 102 via a second interconnection line 80.

In view of a method of manufacturing the OLED 100 for a unit pixel, in succession to the process of FIG. 2Q, a third insulating layer 72 is formed on the entire surface of the second insulating layer 62 using a material, such as $SiO_x$ or $SiN_x$, so as to bury the first interconnection line 70. Thereafter, the second, third, and fourth insulating layers 42, 62, and 72 are sequentially etched, thereby forming a third contact hole $h_3$ through which a partial region of the first drain electrode 30d is exposed. Next, a transparent conductive material such as ITO is filled in the third contact hole $h_3$, so as to form a second interconnection line 80. Next, the first electrode 90 is formed on the third insulating layer 72 using a transparent conductive material, such as ITO, so as to contact the second interconnection line 80. Next, a fourth insulating layer 92 is formed on the entire surface of the third insulating layer 72 using a material, such as $SiO_x$ or $SiN_x$, so as to bury the first electrode 90. Next, a partial region of the fourth insulating layer 92 is etched, thereby forming a fourth contact hole $h_4$ through which the first electrode 90 is exposed. Next, the organic light emitting layer 96 is formed on the fourth insulating layer 92 so as to cover the first electrode 90, and a second electrode 98 is formed on the organic light emitting layer 96 using a conductive material, such as Al or Ag.

Referring to FIGS. 4 and 5, in the organic light emitting display according to the present invention, a second source electrode 31s of a switching TFT ($T_{sw}$) 101 is electrically connected to a data line DL to which a data signal is input from a horizontal driving circuit, for example. As such, the data line DL may be electrically connected to a first gate electrode 50 of a driving TFT ($T_{dr}$) 102 through the second source electrode 31s and the second drain electrode 30d of the switching TFT ($T_{sw}$) 101. A second gate electrode 60 of the switching TFT 101 is electrically connected to a select line SL to which a select signal is input from a vertical scanning circuit. A first source electrode 30s of the driving TFT 102 is electrically connected to a power line PL to which a driving power is supplied from a power circuit. As such, the power line PL may be connected to each OLED 100 for a unit pixel through the first source electrode 30s and the first drain electrode 30d of the driving TFT 102.

The data line DL and the select line SL are disposed to cross perpendicular to each other, and a unit pixel P is defined by a crossing data line DL and a crossing select line SL. Meanwhile, a portion extending from the second drain electrode 31d of the switching TFT 101 and the first gate electrode 50 of the driving TFT 102, which are connected to each other, and the power line PL may constitute a storage capacitor $C_s$ of FIG. 5.

According to the present invention, the driving device for a unit pixel of an organic light emitting display including a pair of a switching TFT and a driving TFT can be manufactured by a series of consecutive processes. In particular, according to the present invention, the structure of the driving device for a unit pixel of an organic light emitting display and the method of manufacturing the same have been improved so that channels in a switching TFT and a driving TFT can be simultaneously formed in one process. As a result, the driving device for a unit pixel of an organic light emitting display according to the present invention can be manufactured in a smaller number of processes and in simpler and easier processes compared to the prior art. Accordingly, a defect rate during manufacturing can be reduced, a manufacturing yield can be increased, and manufacturing reproducibility and reliability can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a driving-device for a unit pixel of an organic light emitting display, the method comprising:
   forming an amorphous silicon layer including a first amorphous region and a second amorphous region disposed on the same plane of a substrate;
   forming an SAM (self-assembled monolayer) having a hydrophobic property on the first amorphous region;
   coating an aqueous solution in which nickel particles are dispersed, on the second amorphous region and the SAM, wherein a larger amount of nickel particles than on the SAM are dispersed on the second amorphous region using a hydrophilicity difference between the second amorphous region and the SAM;
   vaporizing the SAM through an annealing process and simultaneously performing metal induced crystallization in which the nanoparticles are used as a medium, to crystallize the first and second amorphous regions and to form first and second crystallization regions;
   patterning the first and second gate crystallization regions to form first and second channel regions; and
   forming first and second electrodes on the first and second channel regions.

2. The method of claim 1, wherein the first crystallization region is formed to have a first grain size and the second crystallization region is formed to have a second grain size that is smaller than the first grain size.

3. The method of claim 2, wherein the first grain size is in the range of 10 to 300 μm.

4. The method of claim 3, wherein the second grain size is in the range of 0.01 to 50 μm.

5. The method of claim 1, wherein a contact angle of the nickel particle-dispersed aqueous solution with the SAM is controlled in the range of 60° to 100°.

6. The method of claim 5, wherein a contact angle of the nickel particle-dispersed aqueous solution with the second amorphous region is controlled in the range of 20° to 50°.

7. The method of claim 2, wherein the SAM is formed of material such as $R^1(R^2)_n SiCl_{3-n}$, $R^1(R^2)_n Si(OCH_3)_{3-n}$ or $R^1(R^2)_n Si(OCH_2CH_3)_{3-n}$ (n=0, 1, 2), where $R^1$ is a straight, branched or cyclic $C_1$-$C_{10}$ alkyl group, a $C_3$-$C_{20}$ cycloalkyl group, a $C_2$-$C_{10}$ alkenyl group or a fluorine-substituted group thereof, and $R^2$ is hydrogen, a methyl or ethyl group.

8. The method of claim 7, wherein the SAM is formed to a thickness of 3 to 10 Å.

9. The method of claim 2, wherein the amorphous silicon layer is formed to a thickness of 500 to 2000 Å.

10. The method of claim 2, wherein the annealing process is performed at 350° C.-700° C.

11. The method of claim 2, wherein the forming of the SAM having a hydrophobic property on the first amorphous region comprises:
   forming an SAM having a hydrophobic property on an amorphous silicon layer including the first amorphous region and the second amorphous region; and
   selectively etching the SAM formed on the second amorphous region to remove it.

12. The method of claim 11, wherein etching of the SAM is performed by laser lithography, UV lithography or E-beam lithography.

13. The method of claim 2, wherein a first source region and a first drain region are further formed at one end and the other end of the first channel region, respectively.

14. The method of claim 13, wherein a gate insulating layer is further formed between the first channel region and the first gate electrode.

15. The method of claim 13, wherein the first source region includes an n-doped or p-doped Si layer and a first source electrode, which are sequentially stacked on one end of the first channel region.

16. The method of claim 15, wherein the first drain region includes an n-doped or p-doped Si layer and a first drain electrode, which are sequentially stacked on the other end of the first channel region.

17. The method of claim 2, wherein a second source region and a second drain region are further formed at one end and the other end of the second channel region, respectively.

18. The method of claim 17, wherein a gate insulating layer is further formed between the second channel region and the second gate electrode.

19. The method of claim 17, wherein the second source region includes an n-doped or p-doped Si layer and a second source electrode, which are sequentially stacked on one end of the second channel region.

20. The method of claim 19, wherein the second drain region includes an n-doped or p-doped Si layer and a second drain electrode, which are sequentially stacked on the other end of the second channel region.

21. The method of claim 17, wherein the second source region or the second drain region is connected to the first gate electrode so that an electrical signal can be input to the first gate electrode from the second source region or the second drain region.

* * * * *